(12) United States Patent
Liu

(10) Patent No.: US 6,773,967 B1
(45) Date of Patent: Aug. 10, 2004

(54) METHOD TO PREVENT ANTIFUSE SI DAMAGE USING SIDEWALL SPACERS

(75) Inventor: Hsueh-Heng Liu, Kaohsiung (TW)

(73) Assignee: Taiwan Semiconductor Manufacturing Company, Hsin-Chu (TW)

(*) Notice: Subject to any disclaimer, the term of this patent is extended or adjusted under 35 U.S.C. 154(b) by 0 days.

(21) Appl. No.: 10/037,586

(22) Filed: Jan. 4, 2002

(51) Int. Cl.[7] .................. H01L 21/82; H01L 21/28
(52) U.S. Cl. ............................ 438/131; 438/600
(58) Field of Search .................. 438/128, 132, 438/600, 669, 672, 674, 675, 131

(56) References Cited

U.S. PATENT DOCUMENTS

| | | | |
|---|---|---|---|
| 5,250,464 A | * | 10/1993 | Wong et al. ............ 437/170 |
| 5,308,795 A | * | 5/1994 | Hawley et al. ......... 437/195 |
| 5,508,220 A | | 4/1996 | Eltoukhy et al. |
| 5,763,299 A | * | 6/1998 | McCollum et al. ........ 438/131 |
| 5,804,500 A | * | 9/1998 | Hawley et al. |
| 5,807,786 A | | 9/1998 | Chang |
| 6,107,165 A | * | 8/2000 | Jain et al. ............ 438/467 |
| 6,124,193 A | * | 9/2000 | Hawley et al. ......... 438/600 |
| 6,265,257 B1 | * | 7/2001 | Hsu et al. ............ 438/215 |

* cited by examiner

*Primary Examiner*—David A. Zarneke
*Assistant Examiner*—Scott B. Geyer
(74) *Attorney, Agent, or Firm*—George O. Saile; Stephen B. Ackerman; William J. Stoffel

(57) ABSTRACT

A method for forming an antifuse interconnect structure, for a one-time fusible link, with field-programmable gate arrays, has been developed. The process features the use of an amorphous silicon layer, used as the antifuse layer, with the sidewalls of the amorphous silicon layer protected by critical silicon nitride sidewall spacers, during the patterning/etch procedure of the overlying metal layer. The protective sidewall spacers prevent the amorphous Si antifuse from being etched by subsequent processes.

23 Claims, 5 Drawing Sheets

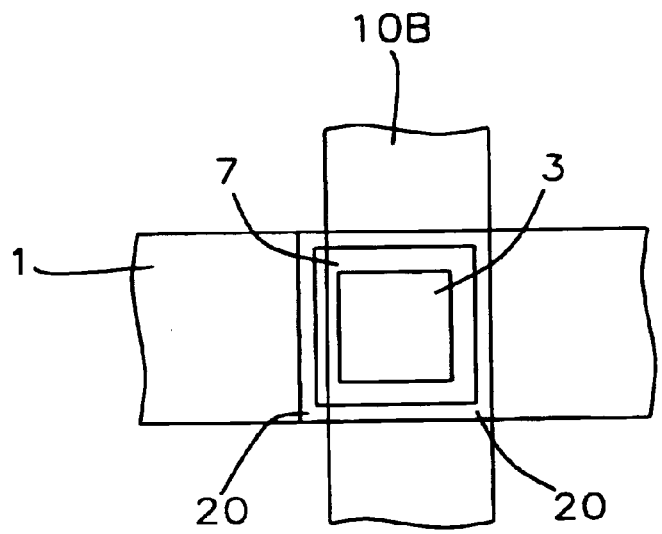
FIG. 7B
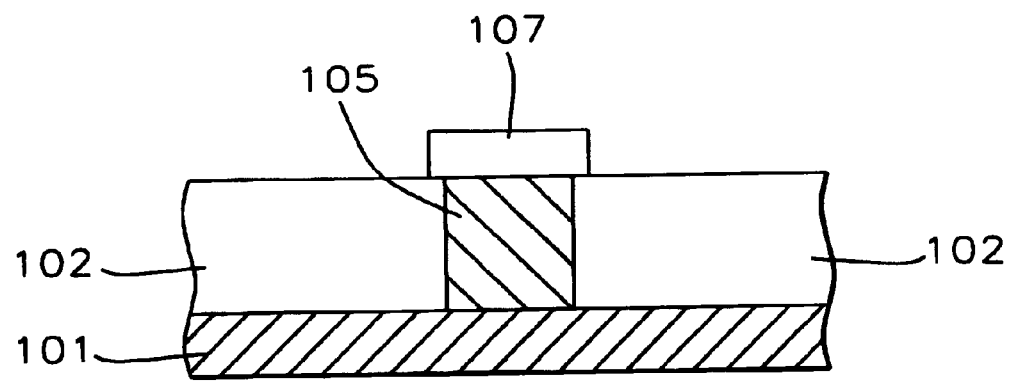
FIG. 8A – Prior Art

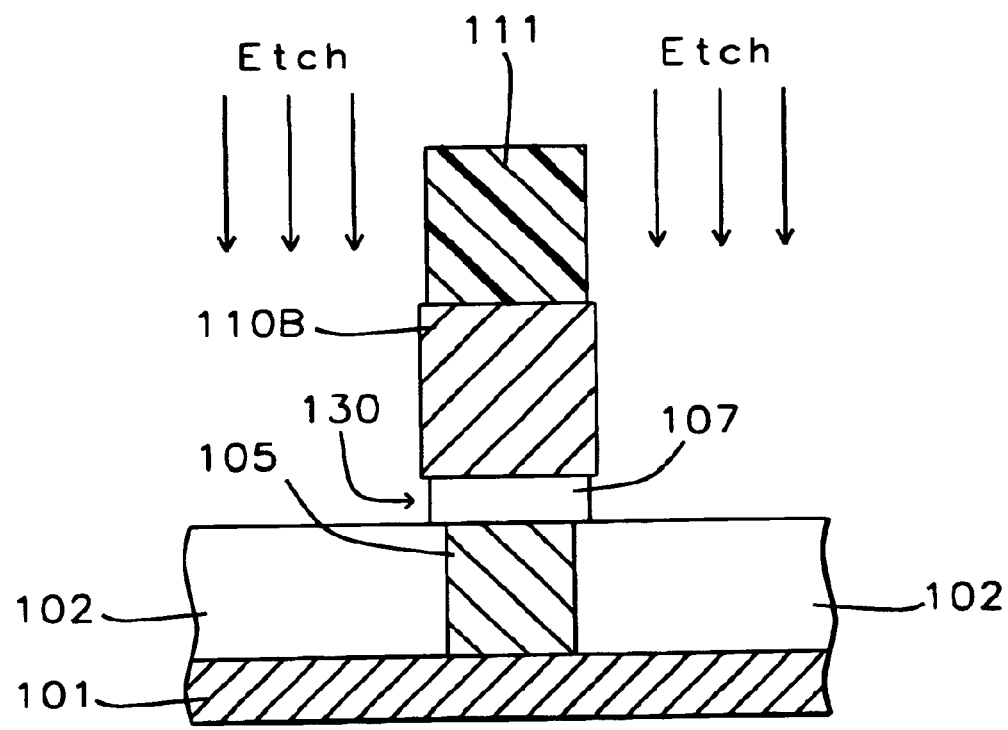
FIG. 8B - Prior Art

METHOD TO PREVENT ANTIFUSE SI DAMAGE USING SIDEWALL SPACERS

BACKGROUND OF THE INVENTION

1) Field of the Invention

This invention relates generally to the fabrication of antifuse-based, programmable interconnect links, for field programmable gate arrays, (FPGA) for semiconductor devices and more particularly method for forming sidewall spacers on antifuse to prevent damage during subsequent metal etching.

2) Description of the Prior Art

Field-programmable gate arrays, (FPGA), have been designed to contain the needed row of arrays, as well as additional rows of spare arrays accessed if needed to replace ineffective counterparts, or to modify a specific design. Recent FPGA designs, feature one-time fusible link structures as possible programmable low resistance interconnect links, if accessed. These additional or spare arrays, or one-time fusible link structures, are sometimes comprised of an antifuse based programmable interconnect structure. The structure consists of an antifuse layer, usually a thin dielectric layer, placed between electrodes or conductive materials. When needed this antifuse material can be ruptured, or converted to a lower resistance layer, via a high voltage electrical pulse, resulting in creation of the replacement array structure.

The antifuse layer, used with the one-time fusible link structure, can be a dielectric layer, such as silicon oxide or silicon nitride. However to perform as an antifuse layer, the dielectric layer has to be thin, to allow reasonable programmable voltages to be successfully used. Thus small increases in the thickness of the thin antifuse dielectric layer, due to uniformity's in the dielectric layer deposition procedure, may result in inadequate programmed links. U.S. Pat. No. 5,807,786 (Chang), (assigned to the same assignee as the invention) describes a simpler process for forming one-time fusible link structures, using an amorphous silicon layer as the antifuse layer. However to avoid contamination, and additional oxide growth, on the amorphous silicon layer, during patterning procedures, a thin conductive barrier layer is used to overlie, and protect, the amorphous silicon antifuse layer, during specific fabrication sequences.

A problem the inventors have discovered is that the sidewalls of amorphous Silicon anti-fuses are damaged (and etched laterally) during the etching of the second electrode (the overlaying metal layer). This invention addresses the problem of lateral etching of the Amorphous Si antifuse.

The importance of overcoming the various deficiencies noted above is evidenced by the extensive technological development directed to the subject, as documented by the relevant patent and technical literature. The closest and apparently mote relevant technical developments in the patent literature can be gleaned by considering the following patents. U.S. Pat. No. 5,508,220 (Eltoukhy et al.) shows a method to form antifuses. U.S. Pat. No. 5,763,299 (McCollum et al.) shows a method to reduce leakage for antifuses. McCollum uses silicon nitride (SiN) layers and a barrier layer over the antifuse. U.S. Pat. No. 5,807,786 (Chang) shows a barrier layer to protect an antifuse. However, none of these patents effectively solves the problem of lateral etching of the Amorphous antifuse during the etching of the overlying metal layer.

SUMMARY OF THE INVENTION

It is an object of this invention to provide a structure offering a one-time fusible link, for field programmable gate array designs.

It is another object of this invention to use an antifuse based interconnect, featuring an amorphous silicon, antifuse layer, for the one-time fusible link structure.

It is another object of this invention to use an antifuse based interconnect, featuring an amorphous silicon antifuse layer, for the one-time fusible link structure that has a silicon nitride anti-fuse sidewall spacer that protects the amorphous Si antifuse form antifuse from etchants and prevent lateral etching of the amorphous Si antifuse.

It is yet another object of this invention to form the amorphous Si antifuse having a SiN sidewall spacer that protects the amorphous Si antifuse form antifuse from etchants and protects the sidewalls of the amorphous silicon layer from subsequent processing procedures.

To accomplish the above objectives, the present invention provides a method of manufacturing an antifuse based interconnect structure, to be used for a one-time fusible link. A semiconductor substrate, comprised of overlying metal interconnect patterns, contacting conductive regions in the semiconductor substrate, is provided. A first metal interconnect structure, to be used as the lower electrode of the antifuse based interconnect structure, is formed, contacting conductive regions in the semiconductor substrate. An interlevel dielectric layer is deposited, preferably followed by a chemical mechanical polishing procedure, used for planarization purposes. A via hole opening is created in the interlevel dielectric layer, exposing the top surface of the first metal interconnect structure. A metal layer is deposited filling the via hole forming a metal plug. An amorphous silicon antifuse layer is next deposited. Patterning, using photolithographic and dry etching procedures, is used to form an amorphous Si antifuse, overlying the metal plug.

In a key step, protective antifuse sidewalls spacers 20 are formed on the antifuse 7 sidewalls. The protective spacers are formed of an etch resistance material and preferably of silicon nitride. A second metal layer is deposited thereover. A photoresist layer is formed over the second metal layer. The second metal layer is etched preferably using an etch chemistry, such as $Cl_2$, or $BCl_3$, that also could etch the amorphous Si antifuse if the invention's spacers where not protecting the antifuse sidewalls.

The metal layer is patterned to form a second interconnect structure, to be used as the upper electrode of the antifuse based interconnect structure, overlying the composite antifuse layer. The invention's protective spacers protect the Silicon amorphous silicon containing antifuse from etch damage in the upper electrode etch process.

The invention solves the following problems:

1. Prevents the amorphous Si antifuse sidewall from being damaged at the subsequent metal (upper electrode) etch.

2. Prevents the amorphous Si antifuse sidewalls from being damaged by stripper in the polymer strip step after metal etch.

The present invention achieves these benefits in the context of known process technology. However, a further understanding of the nature and advantages of the present invention may be realized by reference to the latter portions of the specification and attached drawings.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which:

FIGS. 1 through 6 are taken along the axis 6/6' in FIG. 7.

FIG. 7B is a top down view of the antifuse with protective sidewall spacers 20 where the top metal layer 10B is mis-aligned according to the present invention.

FIGS. 8A and 8B are cross sectional views of a prior art antifuse showing the lateral etching of the antifuse during the top metal layer to for the top electrode.

DETAILED DESCRIPTION OF THE PREFERRED EMBODIMENTS

Figure 1:
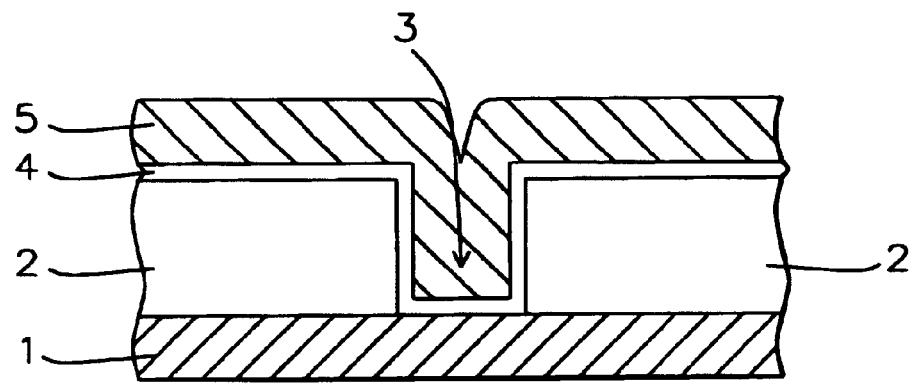
FIGS. 1, 2, 3, 4, 5 and 6 are cross sectional views for illustrating a method for manufacturing an amorphous Si antifuse 7 having silicon nitride sidewall spacers 20 according to the present invention.
Figure 2:
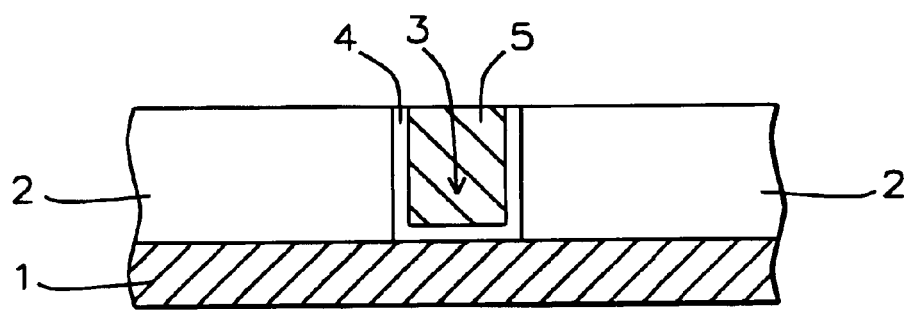

The Problem the Invention's Spacers Solves—Lateral Etching of Antifuse

Referring now to the drawings and more particularly to FIGS. 8A and 8B, there is shown an antifuse structure over which the present invention is an improvement. It is understood in this regard that no portion of FIGS. 8A and 8B is admitted to be prior art for the present invention. Rather, this highly simplified diagram is an effort to provide an improved understanding of the problems that are overcome by the invention.

FIG. 8A shows a bottom meal layer 101. An interlevel dielectric layer 102 is formed thereover. A via hole is formed in the interlevel dielectric layer and a W plug 105 is formed filling the via hole. An amorphous Si antifuse 107 is formed over the plug 105 by depositing an amorphous Si layer and patterning using conventional photo and etch processes.

Next, a metal top layer (not shown) is formed over the antifuse 107. As shown in FIG. 8B, a top photoresist layer 111 is formed over the metal layer. The metal layer is etched to form the $2^{nd}$ top interconnect 110B.

However, the inventor has found that serious problems are caused by the top-metal etching. The second metal layer 10A is etched preferably using an etch chemistry, such as $Cl_2$, or $BCl_3$, that also could etch the amorphous Si antifuse 107.

The inventor has found that:

(1) Amorphous Si antifuse 107 will be damage by metal etching. The etch creates an undercut and weakens the antifuse performance.

(2). The amorphous Si antifuse is a little undercut 130 (etched laterally) during the metal etching; and (3) The amorphous Si antifuse will be damaged by the polymer strip after metal etching. The polymer strip is a wet strip process. A stripper can be ACT 690, ACT 933, EKC25 etc. The main component in these strippers would be cathecal, Dimethyl sulfoxide, (DMSO), MEA, DGA, etc. These chemicals damage the Si of the antifuse.

Invention's Sidewall Spacers 20 Process

The process for forming an amorphous Si antifuse having sidewall SiN spacers 20, to be used for a one-time fusible link, will now be described in detail.

In the following description numerous specific details are set forth such as flow rates, pressure settings, thicknesses, etc., in order to provide a more thorough understanding of the present invention. It will be obvious, however, to one skilled in the art that the present invention may be practiced without these details. In other instances, well known processes have not been described in detail in order to not unnecessarily obscure the present invention. Also, the flow rates in the specification can be scaled up or down keeping the same molar % or ratios to accommodate difference sized reactors as is known to those skilled in the art.

The structure is formed on a semiconductor substrate, preferably comprised of N type and P type conductive regions, in the semiconductor substrate, with overlying metal and insulator patterns, used for wiring purposes. The antifuse based interconnect structure will be fabricated on the integrated wiring patterns present on the semiconductor substrate. The specific conductive regions in the semiconductor substrate, and the overlying wiring patterns, can be formed to achieve complimentary metal oxide semiconductor field effect transistor (CMOS), designs, or BiCMOS designs, used for desired memory applications.

FIG. 1, schematically shows a first interconnect structure 1, formed over an underlying semiconductor substrate (not shown) with the first interconnect structure 1, either contacting a conductive region of the underlying semiconductor substrate, or contacting a wiring level, that in turn contacts a conductive region in the semiconductor substrate. For example, first interconnect structure 1 can be a metal line over a dielectric layer or an active area of a silicon substrate. First interconnect structure 1, is preferably created by initially depositing a layer of an aluminum based metallization, such as pure aluminum, or aluminum, with between about 0 to 3% copper, or aluminum with between about 0 to 3% copper, and with between about 0 to 1% silicon. The aluminum based metallization is preferably deposited using R.F. (radio frequency) sputtering, to a thickness between about 1000 to 10,000 Angstroms.

An optional layer of titanium nitride (not shown) is preferably also deposited, via R.F. sputtering, overlying the aluminum based layer. The TiN layer preferably has a thickness between about 100 to 1600 Angstroms. The metallization used for the first interconnect structure can also be tungsten or tungsten silicide. Patterning of the metal layer is performed using conventional photolithographic and anisotropic reactive ion etching procedures, using $Cl_2$ as an etchant, creating first interconnect structure 1, used as the lower electrode of the antifuse based interconnect structure.

An interlevel dielectric layer (ILD) 2 (e.g., insulator layer), preferably comprised of silicon oxide, is next deposited using plasma enhanced chemical vapor deposition, (PECVD), preferably to a final thickness (after planarization) between about 0.8 to 3.0 $\mu$m. A chemical mechanical polishing (CMP) procedure is preferably then employed to create a smooth top surface topography for interlevel dielectric layer 2. This is shown schematically in FIG. 1. Conventional photolithographic and anisotropic reactive ion etch (RIE) procedures, preferably using $CHF_3$ as an etchant, are used to open via hole 3, in interlevel dielectric layer 2. Via hole 3, with a diameter between about 0.4 to 1.5 $\mu$m, results in the exposure of the top surface of first interconnect structure 1.

A barrier layer of preferably titanium nitride 4, is next deposited using R.F. sputtering procedures, preferably to a thickness between 100 to 1200 Angstroms, coating the exposed surfaces of via hole 3. A tungsten layer 5 is then deposited; via low pressure chemical vapor deposition (LPCVD) procedures, to a thickness between about 4000 to 6000 Angstroms, completely filling via hole 3. This is schematically shown in FIG. 1.

Unwanted regions of tungsten layer 5, as well as unwanted regions of titanium nitride layer 4, are next removed preferably by an anisotropic RIE etch back procedure, using either $CF_4$—$O_2$, $NF_3$—$O_2$, or $SF_6$—$O_2$, as an etchant. The etch back procedure removes unwanted material from the top surface of interlevel dielectric layer 2, creating tungsten plug 5, and tungsten nitride spacers 4, in via hole 3. Alternately, the metal can be chemical-mechanical polished.

Antifuse 7

Figure 3:
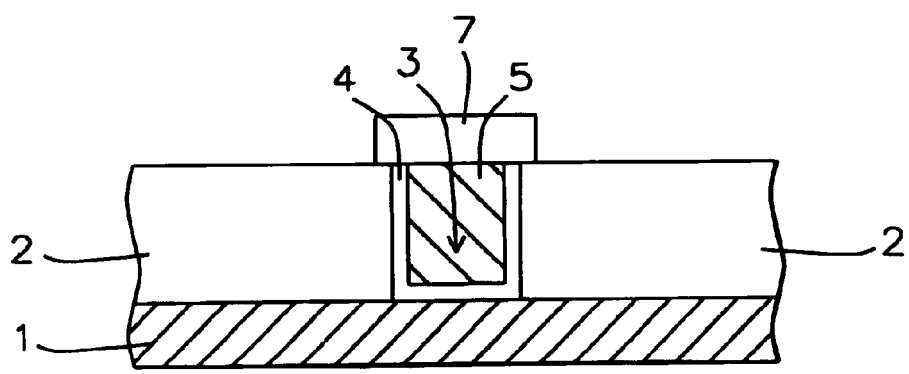

As shown in FIG. 3, a layer of amorphous silicon 7, is deposited preferably using PECVD procedures, at a temperature between about 300 to 500° C. and more preferably between 350° to 450° C., to a thickness between about 600 to 1400 Å and more preferably between 800 to 1200 Angstroms. Amorphous silicon layer 7 will be the layer ruptured, via high voltage pulsing, to form a conductive link between underlying first interconnect structure 1, and a subsequent, overlying second interconnect structure, if desired. Therefore the thickness of the antifuse layer is critical in choosing the correct pulsing voltage.

Also, an optional barrier layer (not shown) composed of TiN can be formed over the amorphous silicon layer 7. The barrier layer preferably has a thickness of between about 200 and 300 Å. It is a major advantage of the present invention that this barrier layer is not required because of the invention's SiN antifuse spacers 20.

FIG. 3 shows the patterning of the amorphous silicon layer is accomplished via anisotropic RIE procedures, preferably using $Cl_2$ as an etchant, and using a photoresist shape as a mask resulting in the antifuse shape, with a diameter between about 0.7 to 0.9 uM, directly overlying tungsten plug 5. This is schematically shown in FIG. 3.

Removal of photoresist shape, via oxygen ashing and wet clean procedures, is next performed exposing the amorphous Si antifuse 7.

Protective Sidewall Spacers 7

Figure 4:
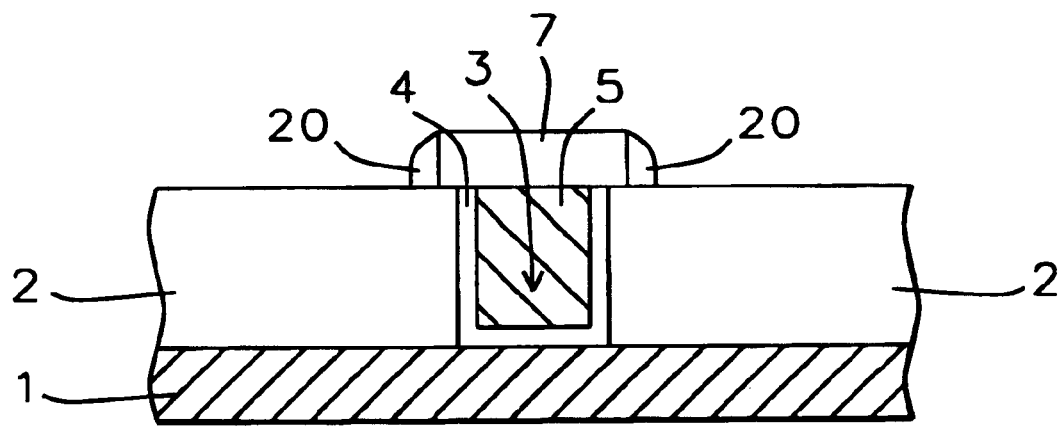

Next, as shown on FIG. 4, antifuse sidewall spacers 7 are formed on the sidewalls for the amorphous Si antifuse 7. The spacers are preferably formed of an etch resistance material such as $SiO_2$, Silicon oxynitride (SiON) or silicon nitride (SiN) and are most preferably formed of SiN. The inventors have found that spacers formed of SiN have performance advantages over spacers formed of $SiO_2$. $SiO_2$ spacers are inferior to SiN spacers. SiN spacers are the most preferred composition. The spacers preferably have a width of between about 100 and 2000 Å.

The invention's spacers 20 are formed by the well known process of forming a SiN layer over the surface and then anisotropically etching the SiN layer to form spacers 7. It is critical that the antifuse spacers are used as an endpoint detection during the SiN anisotropic. This is a major point of the invention. Because the invention can use the SiN layer for endpoint detection, it reduces the oxide layer that reduces the topology (e.g., invention has a lower module height because of less oxide loss.

The invention's SiN spacers have major advantages over $SiO_2$ spacers. The invention's SiN spacers can be used for an endpoint detect whereas $SiO_2$ spacers can not. The spacers can solve the topography issues.

Top Electrode 10B

A metal layer 10A, needed for a second interconnect structure, or the upper electrode 10B of the antifuse interconnect structure, is next deposited. Metal layer 10A, is preferably deposited using R.F. sputtering procedures, is comprised of an aluminum based layer, that can contain copper and silicon, at a thickness between about 4000 to 10000 Angstroms.

Figure 5:
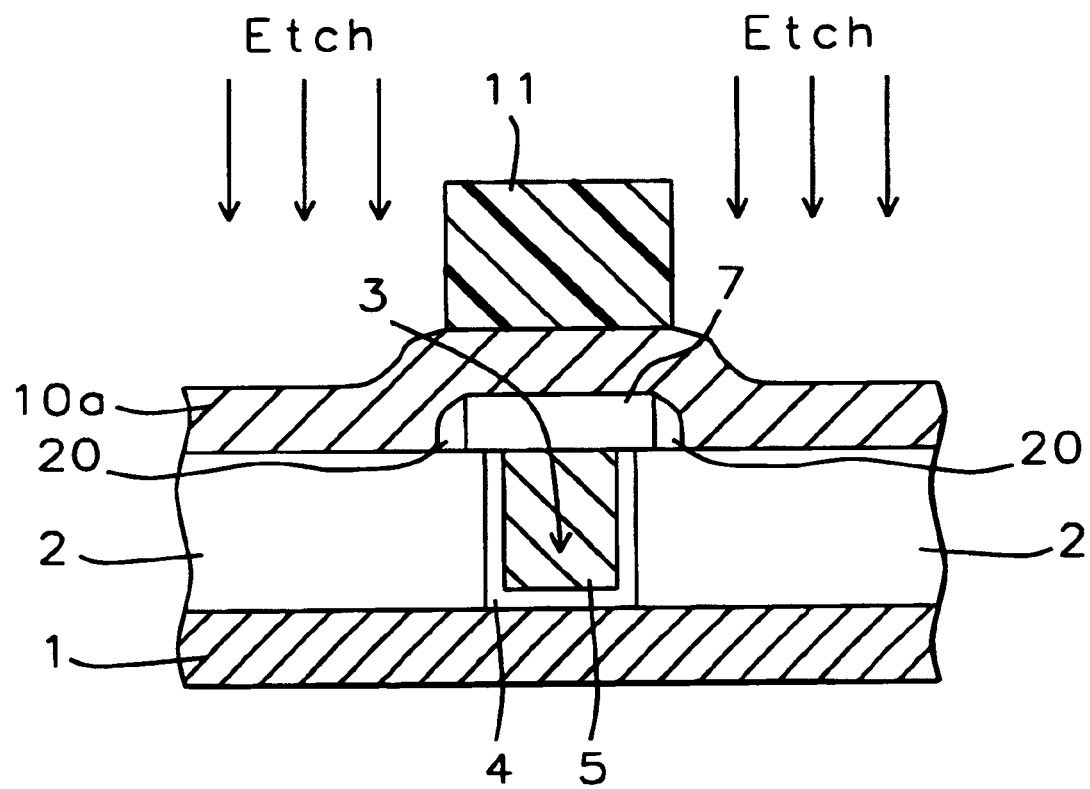

In a preferred embodiment, the aluminum based layer is placed between an underlying layer of titanium nitride (not shown), and an overlying layer of titanium nitride (not shown). Photoresist shape 11, to be used as a mask for the creation of the second interconnect structure, is also shown schematically in FIG. 5.

RIE Etch Step—Spacers 20 Protect the Antifuse 7

Figure 6:
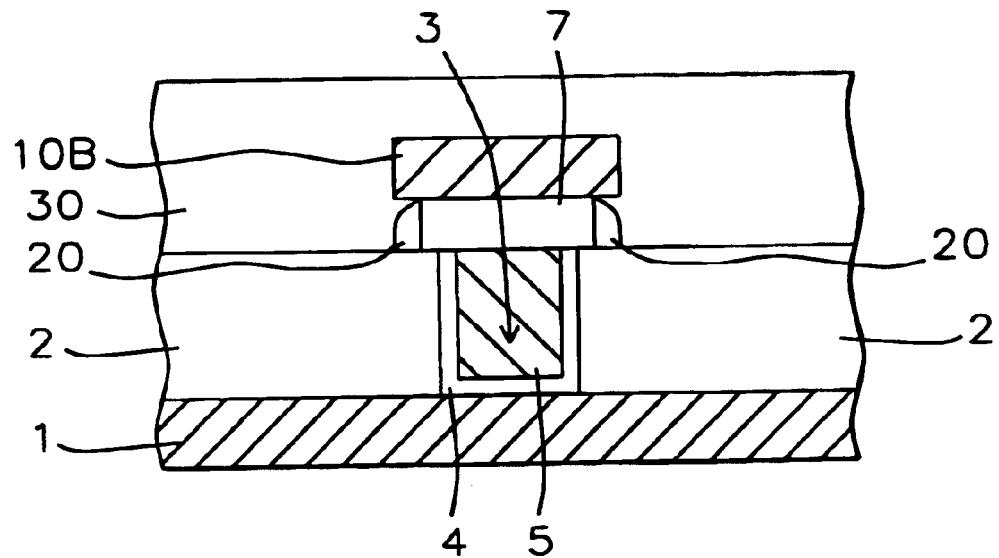

As shown in FIG. 6, The metal layer 10A is anisotropic RIE etched form a second interconnect structure 10B. The etch preferably uses $Cl_2$ or $BCl_3$, Ar, $CF_4$ or $SF_6$.

The invention's SiN spacer can be used as an endpoint detect. This is a key advantage of the invention over the prior art. In contrast, oxide spacers can not. Oxide spacers can not be used for the endpoint detection because the layer 2 is formed of an oxide containing material.

If the invention's spacers 7 where not present, the etchants would attach and laterally etch (undercut 130) the amorphous Si antifuse 7 as shown in FIG. 8B.

The width of second interconnect structure 10B, is preferably between about 4000 Å to 1000 Å. Photoresist shape 11, is again removed via oxygen plasma ashing and wet cleans, resulting in the antifuse interconnect structure featuring an amorphous silicon antifuse 7, placed between conductive electrodes 5 and 10B. This is schematically shown in FIG. 6. A top view of the antifuse interconnect structure, cross-sectional shown in FIG. 6, is presented in FIG. 7. FIG. 7 shows a top down view of the structure.

Photoresist Removal and Polymer Removal—SiN Spacer Protect the Antifuse 20

Next the photoresist layer is removed preferably using photoresist stripper.

Often during the metal etch, a polymer forms on the antifuse sidewall and spacer sidewalls. An additional stripper or wet acid etch is used to remove the polymer. Without the invention's SiN spacers, the amorphous Si antifuse will be damaged by the polymer strip after metal etching. The polymer strip is a wet strip process. A stripper can be ACT 690, ACT 933, FKC25 etc. The main component in these strippers would be cathecal, Dimethyl sulfoxide, (DMSO), MEA, DGA, etc. These chemicals damage the Si of the antifuse.

The invention's SiN sidewalls spacers prevents antifuse damage from the photoresist and polymer strippers. In contrast, if $SiO_2$ spacers (not the invention's SiN spacers) were used, the wet etch and strippers (used to remover the polymer) would damage the $SiO_2$ spacers and antifuse 7. This is a key advantage of the invention's SiN spacer over $SiO_2$ spacers.

FIG. 6 shows a dielectric layer 30 formed over the structure. Other conductive and dielectric layers and interconnects can be formed thereover the complete the device.

Figure 7A:
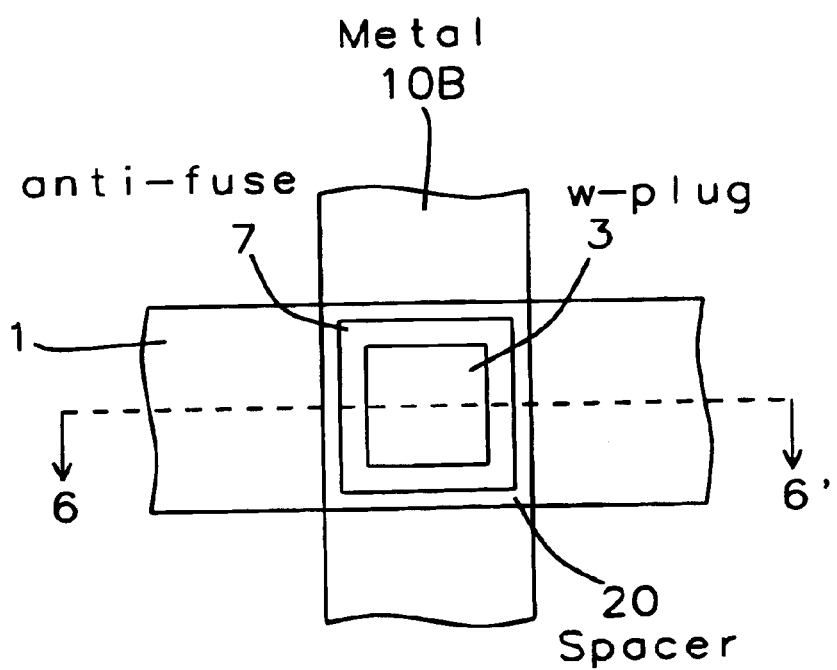
FIG. 7A is a top down view of the antifuse with protective sidewall spacers 20 according to the present invention.

FIG. 7A is a top down view of the antifuse with protective sidewall spacers 20 where the top metal layer 10B is aligned properly according to the present invention. FIG. 6 is taken along axis 6/6' in FIG. 7.

FIG. 7B is a top down view of the antifuse with protective sidewall spacers 20 where the top metal layer 10B is mis-aligned according to the present invention.

Advantages of the Invention over the Prior Art

The invention's SiN spacers and amorphous antifuse have the following advantages over the prior art.

1) The antifuse can be made with out a barrier layer therefore a different and simpler/less costly antifuse 7 can be made comprising only of amorphous Si.

2) SiN spacers can be used for endpoint detection during the SiN etch that defines the spacers (anisotropic spacer etch), whereas oxide spacer can not. This improves the critical $2^{nd}$ interconnect 10B layer etch.

3) The SIN spacers improve the topography issue.

In contrast with U.S. Pat. No. 5,763,299 (McCollum) the invention does not use barrier layer (McCollum's layers 16 and 18) below the amorphous Si antifuse. The invention's lack of a McCollum's barrier layer allows the invention's module height to be reduced. Also, it increases the process window during the top electrode etch. Because the invention can use the SiN layer for endpoint detection, it reduces the oxide layer that reduces the topology (e.g., invention has a lower module height because of less oxide loss.)

It should be recognized that many publications describe the details of common techniques used in the fabrication process of integrated circuit components. Those techniques can be generally employed in the fabrication of the structure of the present invention. Moreover, the individual steps of such a process can be performed using commercially available integrated circuit fabrication machines. As specifically necessary to an understanding of the present invention, exemplary technical data are set forth based upon current technology. Future developments in the art may call for appropriate adjustments as would be obvious to one skilled in the art.

While the invention has been particularly shown and described with reference to the preferred embodiments thereof, it will be understood by those skilled in the art that various changes in form and details may be made without departing from the spirit and scope of the invention.

What is claimed is:

1. A method of forming an antifuse based interconnect structure having an amorphous Si antifuse with SiN sidewalls spacers, comprising the steps of:
   a) providing active elements in a semiconductor substrate; said active elements in said semiconductor substrate, are MOSFET devices, configured in a gate array pattern;
   b) forming a first interconnect structure, contacting said active element, in said semiconductor substrate;
   c) depositing an insulator layer, on said first interconnect structure;
   d) forming a via hole in said insulator layer, exposing top surface of said first interconnect structure;
   e) forming a metal plug in said via hole;
   f) forming an antifuse, contacting said metal plug; said antifuse comprised of amorphous silicon;
   g) forming antifuse spaces on the sidewalls of said antifuse; said antifuse spacers are composed of silicon nitride;
   h) forming a metal layer over said antifuse spacers and said antifuse; and
   i) patterning by etching said metal layer to form a second interconnect structure, contacting said antifuse layer whereby said antifuse spacers protect said anti-fuse from the etching of said metal layer.

2. The method of claim 1 wherein the step (i) of patterning by etching said metal layer to form a second interconnect structure, comprising:
   (2a) forming a photoresist pattern over said metal layer;
   (2b) etching said metal layer to form a second interconnect structure, contacting said antifuse; the etching comprises a reactive ion etch process using $Cl_2$ or $BCl_3$ etchants; whereby said antifuse spacers protect said antifuse from said etchants and said antifuse spacers are used as an endpoint detection; and whereby the etching creates a polymer on the antifuse spacers,
   (2c) removing said photoresist layer using a stripper; and
   (2d) removing said polymer using a wet etch whereby said antifuse spacer protects said antifuse.

3. The method of claim 1 wherein said antifuse spacers have a thickness of between about 100 and 2000 Å.

4. The method of claim 1, wherein said first interconnect structure is formed from an underlying aluminum based layer, containing between about 0 to 3% copper, and between about 0 to 1% silicon, at a thickness between about 1000 to 10,000 Angstroms, and an overlying titanium nitride layer, at a thickness between about 1200 to 1600 Angstroms.

5. The method of claim 1, wherein said first interconnect structure can be formed from a material selected form the group of tungsten, titanium-tungsten, or tungsten silicide.

6. The method of claim 1, wherein said insulator layer is silicon oxide, deposited using plasma enhanced chemical vapor deposition procedures, and planarized using chemical mechanical polishing procedures, to create a final thickness, for said insulator layer, between about 0.8 to 3 $\mu$m.

7. The method of claim 1, wherein said via hole, in said insulator layer, is formed via anisotropic RIE, using $CHF_3$ as an etchant, with said via hole having a diameter between about 0.4 to 1.5 $\mu$m.

8. The method of claim 1, wherein said metal plug, in said via hole, are formed by anisotropic RIE etch back procedures, using an etchant selected form the group consisting of; $CF_4$—$O_2$, $NF_3$—$O_2$, and $SF_6$—$O_2$.

9. The method of claim 1, wherein said antifuse layer, is a composite layer, comprised of an amorphous silicon layer, deposited using PECVD procedures, at a temperature between about 350° to 450° C., to a thickness between about 800 to 1200 Angstroms.

10. The method of claim 1, wherein said second interconnect structure is formed from an aluminum based layer, containing copper, silicon, titanium nitride or titanium-tungsten.

11. A method for forming an antifuse based interconnect structure with an antifuse comprised of amorphous Si and having antifuse spacers on the sidewalls of said antifuse, comprising the steps of:
   a) providing active elements in a semiconductor substrate;
   b) forming a first interconnect structure contacting said active elements, in said semiconductor substrate;
   c) depositing a first insulator layer; said first insulator layer comprised of silicon oxide;
   d) planarizing said first insulator layer;
   e) opening a via hole in said first insulator layer, exposing top surface of said first interconnect structure;
   f) depositing a first titanium nitride layer, coating the sides of said via hole;
   g) depositing a tungsten layer, completely filling said via hole to form a metal plug;
   h) depositing an amorphous silicon layer over said metal plug and said first insulator layer;
   i) patterning of said amorphous silicon layer, to form an antifuse, and
   j) forming antifuse spacers on the sidewalls of said antifuse; said antifuse spacers composed only of silicon nitride; said antifuse spacers are used as an endpoint detection;
   k) forming a metal layer over said antifuse spacers and said antifuse;
   l) forming a photoresist pattern over said metal layer;
   m) etching said metal layer to form a second interconnect structure, contacting said antifuse; the etching comprises a RIE process using $Cl_2$ or $BCl_3$ etchants; whereby said antifuse spacers protect said antifuse from said etchants and whereby the etching creates a polymer on the antifuse spacers;

n) removing said photoresist layer using a stripper;

o) removing said polymer using a wet etch where by said antifuse spacer protects said antifuse.

12. The method of claim 11 wherein said antifuse spacers have a thickness of between about 100 and 2000 Å.

13. The method of claim 11 wherein said active elements in said semiconductor substrate are MOSFET devices, configured in a gate array pattern.

14. The method of claim 11 wherein said first interconnect structure is formed from an underlying aluminum based layer, containing between about 0 to 3% copper, and between about 0 to 1% silicon, at a thickness between about 3000 to 5000 Angstroms, and an overlying titanium nitride layer, at a thickness between about 1200 to 1600 Angstroms.

15. The method of claim 11 wherein said first insulator layer is silicon oxide, deposited using PECVD procedures, and is planarized to a final thickness between about 0.8 to 3.0 μm.

16. The method of claim 11 wherein said via hole is formed in said first insulator layer, via anisotropic RIE procedures, using $CHF_3$ as an etchant.

17. The method of claim 11 wherein said first titanium nitride layer is deposited using R.F. sputtering, to a thickness between about 800 to 1200 Angstroms.

18. The method of claim 11 wherein said tungsten layer is deposited using LPCVD procedures, at a thickness between about 4000 to 6000 Angstroms.

19. The method of claim 11 wherein said titanium nitride spacers, and said tungsten plug, are formed in said via hole, via anisotropic RIE procedures, using $Cl_2$ as an etchant.

20. The method of claim 11 wherein said amorphous silicon layer is deposited using LPCVD procedures, at a temperature between about 350° to 450° C., to a thickness between about 800 to 1200 Angstroms.

21. The method of claim 11 wherein said antifuse is formed via anisotropic RIE of said amorphous silicon layer, using $Cl_2$ as an etchant.

22. The method of claim 11 wherein said second interconnect structure is formed from an aluminum based layer, that can contain copper, silicon, titanium nitride or titanium-tungsten.

23. A method of forming an antifuse based interconnect structure having amorphous Si antifuse with SiN sidewalls spacers, comprising the steps of:

a) providing active elements in a semiconductor substrate;

b) forming a first interconnect structure, contacting said active elements, in said semiconductor substrate;

c) depositing an insulator layer, on said first interconnect structure;

d) forming a via hole in said insulator layer, exposing top surface of said first interconnect structure;

e) forming a metal plug in said via hole;

f) forming an antifuse, contacting said metal plug; said antifuse consists of amorphous silicon;

g) forming antifuse spacers on the sidewalls of said antifuse; said antifuse spacers are composed of silicon nitride;

h) forming a metal layer on said antifuse spacers and said antifuse; said metal layer does not comprise a barrier layer; and i) patterning by etching said metal layer to form a second interconnect structure, contacting said antifuse layer whereby said antifuse spacers protect said anti-fuse from the etching of said metal layer.

\* \* \* \* \*